United States Patent [19]
Sitko et al.

[11] Patent Number: 5,989,786
[45] Date of Patent: Nov. 23, 1999

[54] EMBOSSED METAL GASKET AND METHOD OF MANUFACTURING THE SAME

[75] Inventors: Mark C. Sitko, Farmington Hills; Alan C. Wesley, Sterling Heights, both of Mich.

[73] Assignee: Farnam/Meillor Sealing Systems Inc., Troy, Mich.

[21] Appl. No.: 08/820,251

[22] Filed: Mar. 18, 1997

[51] Int. Cl.⁶ .................................. G03C 5/58; G03F 7/00
[52] U.S. Cl. .............................................. 430/320; 430/323
[58] Field of Search ..................................... 430/320, 313, 430/312, 394, 316, 318, 323

[56] References Cited

U.S. PATENT DOCUMENTS

| | | | |
|---|---|---|---|
| 4,395,441 | 7/1983 | Farnam | 427/211 |
| 4,761,364 | 8/1988 | Schmauder | 430/308 |
| 4,968,045 | 11/1990 | Abe et al. | 277/235 |
| 5,595,858 | 1/1997 | Akama et al. | 430/314 |
| 5,759,417 | 6/1998 | Inaba | 216/18 |

*Primary Examiner*—Kathleen Duda
*Assistant Examiner*—Jill N. Holloman
*Attorney, Agent, or Firm*—Rohm & Monsanto, PLC; Marjorie G. Basile

[57] ABSTRACT

A method of manufacturing an embossed metal gasket includes the steps of supplying a metal gasket preform having opposed first and second planar surfaces and at least one sealing port defined therein, laminating the opposed planar surfaces with a chemical resist material, masking the chemical resist material on the first planar surface in such a manner so as to delineate a raised surface area of a bead circumscribing the sealing port, masking the chemical resist material on the second planar surface in such a manner so as to delineate a recessed surface area of the bead circumscribing the sealing port, curing the unmasked chemical resist material on the opposed planar surfaces of the preform, removing the uncured chemical resist material from the opposed planar surfaces, and exposing the gasket preform to a chemical etching agent to reduce the thickness of the gasket preform in areas which are absent cured chemical resist material.

26 Claims, 8 Drawing Sheets

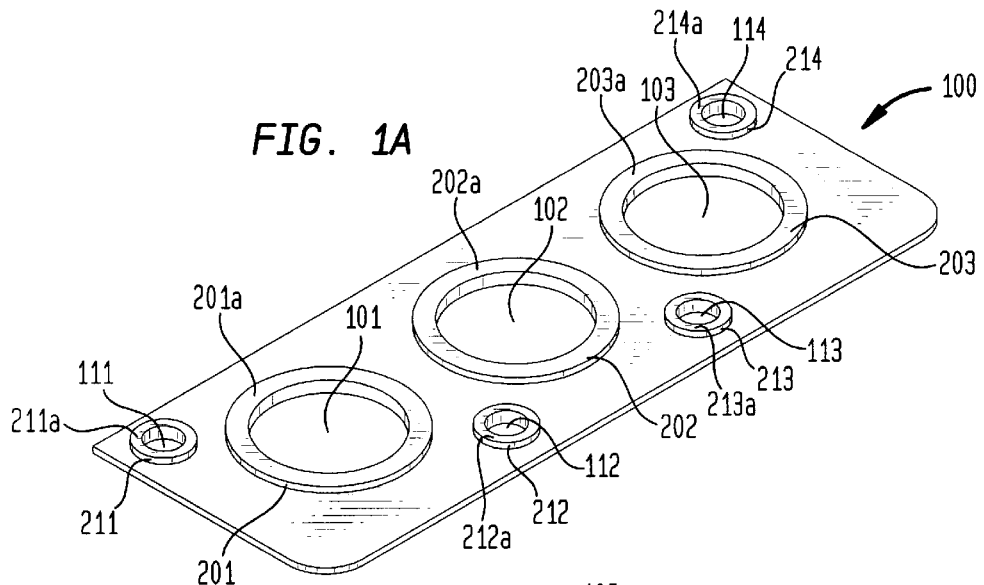
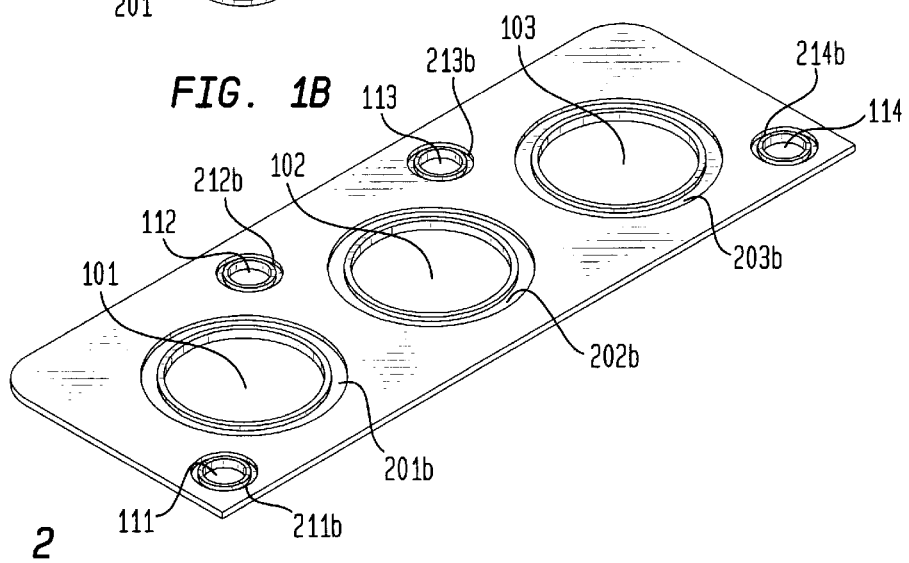
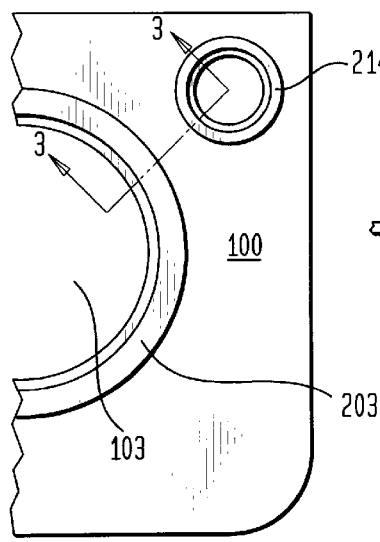
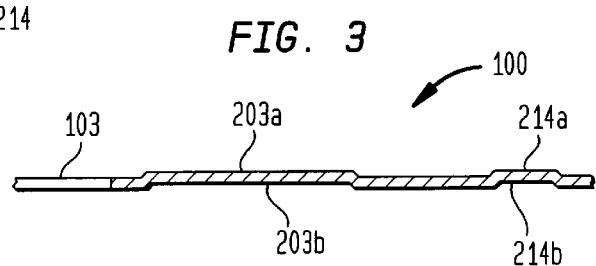

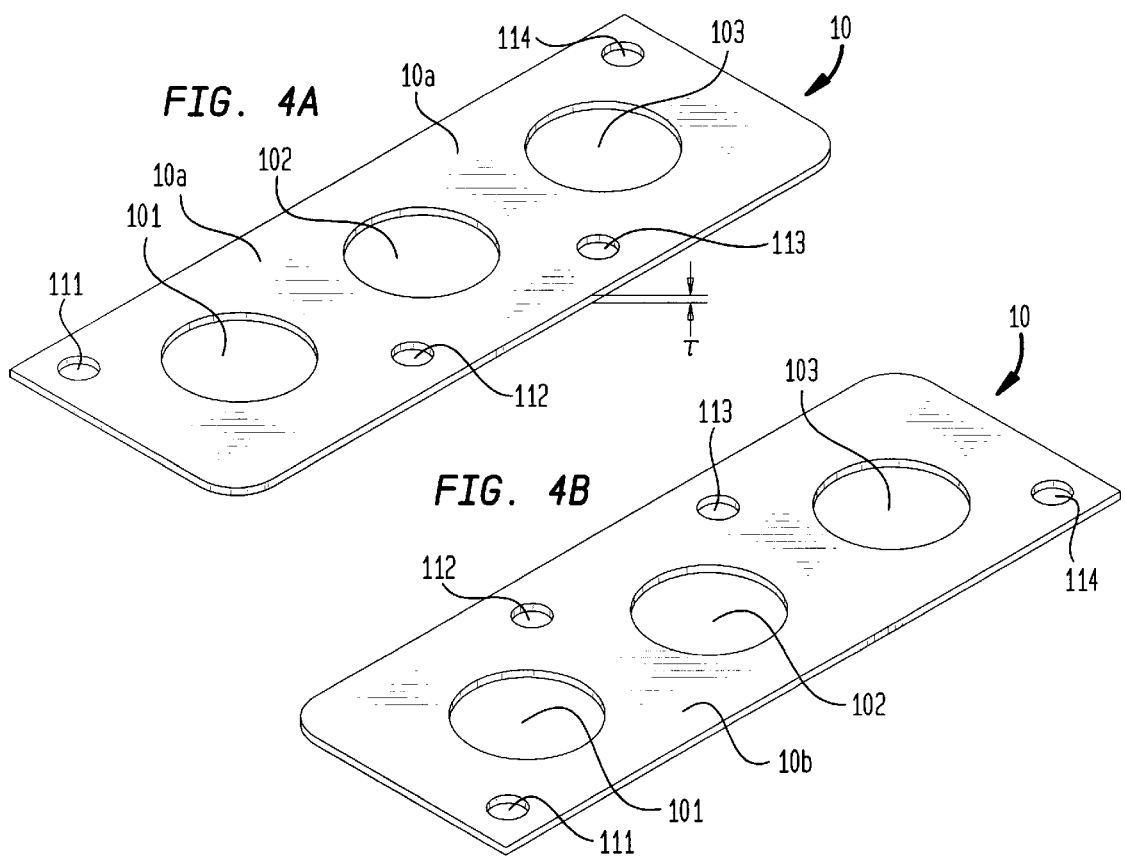
FIG. 4A
FIG. 4B
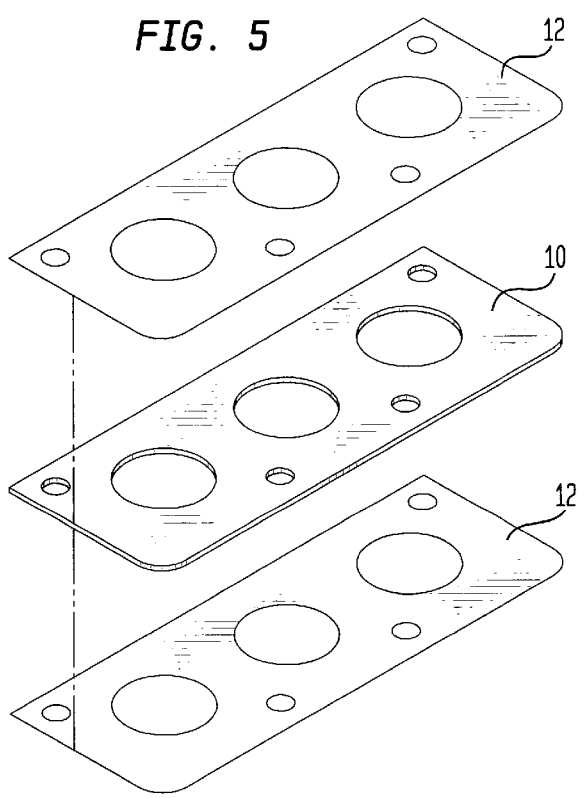
FIG. 5

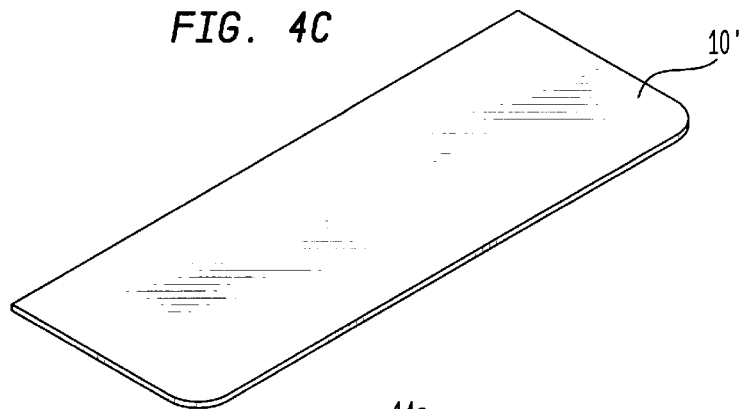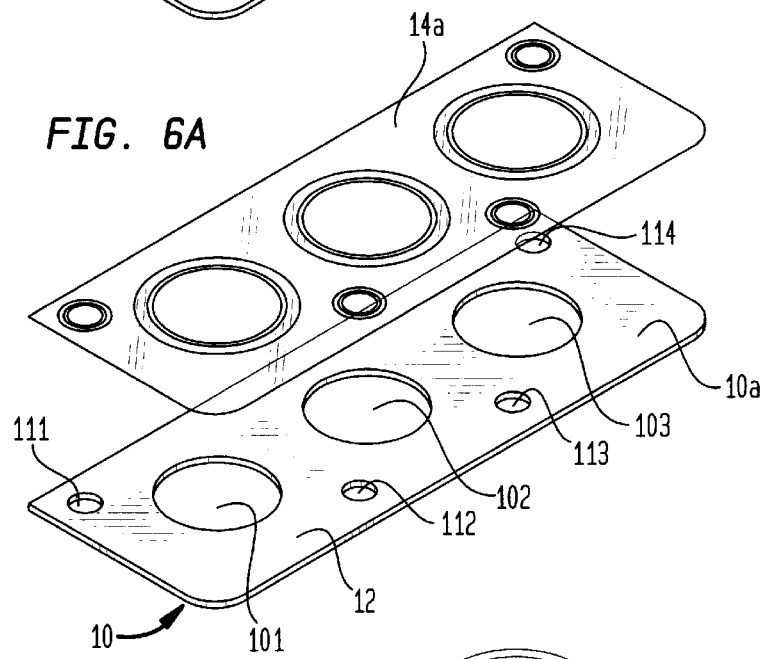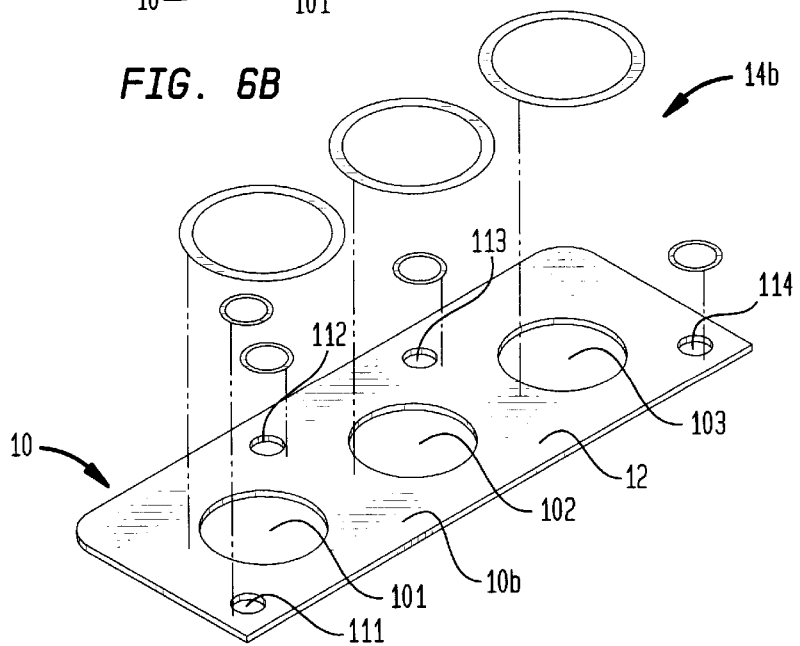

EMBOSSED METAL GASKET AND METHOD OF MANUFACTURING THE SAME

BACKGROUND OF THE INVENTION

1. Field of the Invention

The subject invention is related to automotive gasket technology, and more particularly, to a method of manufacturing an embossed metal engine gasket by chemical etching.

2. Background of the Related Art

Metal gaskets are traditionally used to form a seal between two mating components of a mechanical system or device such as an internal combustion engine, to prevent leakage of combustion gases, cooling water, lubricating oil, or the like. A common application involves placement of a gasket between the engine block and cylinder head. Cylinder head gaskets typically extend around the cylinder bores of an engine to seal high pressure combustion gases within the cylinder bores. Once installed, the gasket bears the load from a bolted connection of the engine components and relies upon this load to provide an adequate seal therebetween.

To function as a reliable seal, it is known to provide a raised bead in a metal gasket in the area which surrounds a cylinder bore. The bead elastically deforms by tightening a bolt connection, and the elastic restoring force of the bead provides the required sealing effect. Traditional manufacturing techniques consist of forming a beaded metal gasket by press-forming the bead contour using male and female die halves or molds. This technique requires expensive tooling and can become particularly costly during the design and prototype stages of gasket manufacture.

There is a need in the metal gasket manufacturing art to provide an efficient method of producing an embossed metal gasket which does not require the fabrication of expensive tools and dies.

SUMMARY OF THE INVENTION

The subject invention is directed to a unique and inexpensive method of manufacturing an embossed automotive gasket, and more particularly, to a method of chemically etching a metal gasket including at least one sealing port having a bead circumscribing the periphery thereof, the bead being defined on a first side of the metal gasket by a raised surface area and on a second side of the metal gasket by a recessed surface area. The invention is also directed to a chemically etched metal gasket manufactured in accordance a preferred embodiment of the method disclosed herein.

In a preferred embodiment of the subject invention, the method includes the initial step of supplying a metal gasket preform having a predetermined thickness and opposed first and second planar surfaces. The method further includes the steps of laminating the opposed planar surfaces of the gasket preform with a chemically resistive material, applying a first template or set of templates to the first planar surface of the gasket preform to mask the chemically resistive material thereon in such a manner so as to delineate at least a first portion of at least one sealing port and a raised surface area of a bead circumscribing the sealing port, and applying a second template or set of templates to the second planar surface of the gasket preform to mask the chemically resistive material thereon in such a manner so as to delineate at least a second portion of the sealing port and a recessed surface area of the bead circumscribing the sealing port.

The method further includes the steps of curing the unmasked chemically resistive material on the opposed planar surfaces of said gasket preform, removing the uncured chemically resistive material from the opposed planar surfaces of the gasket preform, and subsequently exposing the gasket preform to a chemical etching agent for a predetermined period of time so as to reduce the thickness of the gasket preform in areas which are absent cured chemically resistive material, thereby forming the sealing port and the opposed raised and recessed surface areas of a bead circumscribing the periphery of the sealing port.

In accordance with the subject invention, the step of laminating the opposed planar surfaces of the gasket preform includes coating the opposed surfaces with dry film layers of photochemical resist material. The method also includes the step of fabricating the first and second templates or sets of templates, which includes the additional steps of generating graphic representations of opposed first and second sides of the metal gasket, generating a respective lithograph or rubylith of each graphic representation, and photographically reproducing a respective negative image of each lithograph or rubylith.

According to the subject invention, the step of curing the unmasked chemically resistive material includes the step of exposing the unmasked photochemical resist material to ultraviolet radiation, and the step of removing the uncured chemically resistive material includes the step of bathing the gasket preform in a developer chemical. Preferably, the step of exposing the gasket preform to a chemical etching agent includes the step of spraying the opposed first and second planar surfaces of the gasket preform with ferric chloride, or a similar substance.

The method further includes the step of removing the cured chemically resistive material from the metal gasket by placing the metal gasket in a stripping solution, and the sequential steps of rinsing and drying said metal gasket. The method may also include the additional step of applying an elastomeric coating material to at least one of the opposed first and second surfaces of the metal gasket.

Further features of the method of manufacture of the subject invention will become more readily apparent to those having ordinary skill in the art from the following detailed description of the invention taken in conjunction with the drawings.

BRIEF DESCRIPTION OF THE DRAWINGS

So that those having ordinary skill in the art to which the subject invention appertains will more readily understand how to manufacture an embossed metal gasket in accordance with the method of the subject invention, a preferred embodiment of the method will be described in detail hereinbelow with reference to the drawings wherein:

FIG. 1a is a perspective view from above of an embossed engine gasket constructed in accordance with the method of the subject invention;

FIG. 1b is a perspective view from below of the engine gasket illustrated in FIG. 1a;

FIG. 2 is an enlarged top plan view of a portion of the embossed engine gasket illustrated in FIG. 1a;

FIG. 3 is an enlarged cross-sectional view of the of the embossed engine gasket of FIG. 1a taken along line 3—3 of FIG. 2;

FIG. 4a is a perspective view from above of a gasket preform utilized during the method of the subject invention which has preformed apertures;

FIG. 4b is a perspective view from below of the gasket preform illustrated in FIG. 4a;

FIG. 4c is a perspective view from above of a gasket preform utilized during the method of the subject invention which does not include preformed apertures;

FIG. 5 is an exploded perspective view of the gasket preform of FIG. 4a with top and bottom layers of a dry film laminant separated therefrom for ease of illustration;

FIG. 6a is an exploded perspective view from above of the laminated gasket preform with upper template elements separated therefrom for ease of illustration;

FIG. 6b is an exploded perspective view from below of the laminated gasket preform with lower template elements separated therefrom for ease of illustration;

DETAILED DESCRIPTION OF THE PREFERRED EMBODIMENTS

Figure 7A:
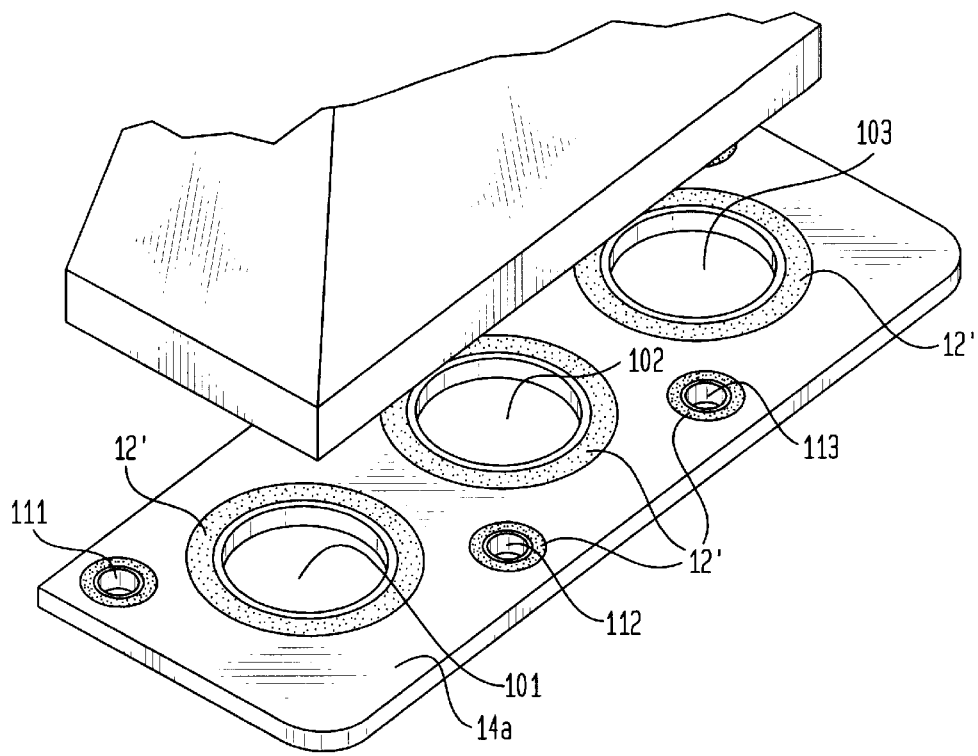
FIG. 7a is a perspective view from above illustrating the top surface of the laminated gasket preform with the template elements applied thereto and exposed to ultraviolet radiation to cure the photochemical resist material disposed about the periphery of each opening defined in the gasket.

Referring now in detail to the drawings wherein like reference numerals identify similar structural elements of the subject invention, there is illustrated in FIGS. 1a and 1b an embossed engine gasket manufactured in accordance with the photo-chemical etching process of the subject invention and designated generally by reference numeral 100. Metallic engine gasket 100 is intended for use as a static seal between the cylinder head and the engine block of an internal combustion engine to seal high pressure combustion gases within the cylinder bores. However, those skilled in the art will readily appreciate that the chemical etching process of the subject invention can be employed to fabricate embossed metallic gaskets for use as static seals between other engine components, such as, for example, between an intake manifold and a cylinder head, or between an exhaust manifold and a cylinder head. It should also be appreciated that engine gaskets formed in accordance with the subject invention can be employed as static seals between components of an exhaust system or transmission of an automobile or other motor vehicles.

Referring to FIGS. 1a and 1b, engine gasket 100, which is preferably constructed from either 301 or 304 stainless steel, steel, copper or a similar material, includes three spaced apart circular sealing bores 101, 102 and 103, each dimensioned and configured to extend about the periphery of a respective cylinder bore of an internal combustion engine with which it is employed. Those skilled in the art will appreciate that gasket 100 would be employed on one side of a horizontally opposed six cylinder or V-6 engine block.

As best seen in FIG. 2, circumferential embossed beads 201, 202, and 203 extend about the peripheries of sealing ports 101, 102, and 103, respectively. As shown in FIGS. 1a, 1b, and 3, each bead has a raised contact surface 201a, 202a and 203a projecting upwardly from the top surface 100a of engine gasket 100 and a recessed surface 201b, 202b and 203b defined in the bottom surface 100b of engine gasket 100. The embossed beads are designed to elastically deform or compress under an applied load so that the elastic restoring force of the material provides an enhanced seal about each combustion port. Those skilled in the art will readily appreciate that alternative embossment configurations other than the single bead configuration illustrated in FIGS. 1a and 1b can be formed around the sealing ports of engine gasket 100. For example, it is envisioned that a double bead configuration could be chemically etched into the opposed surfaces of the gasket preform. Other configurations as well as alternative bead profiles are also envisioned.

A plurality of sealing ports 111–114 of lesser diameter than the combustion chamber sealing ports 101–103 are also defined in engine gasket 100 for accommodating bolts, or for providing a seal about the periphery of lubricating ports and/or cooling ports. Circumferential embossed beads 211–214 extend about the periphery of each of the lesser sealing ports 111–114, respectively, to enhance the sealing effects of the gasket. Embossed beads 211–214 have raised contact surfaces 211a–214a, respectively, and lower recessed surfaces 211b–214b, respectively.

The gasket fabrication process of the subject invention requires the initial preparation of a set of "photo-tools" or photo-opaque templates for application to the top and bottom surfaces of the gasket preform. To prepare the phototools, a computer aided drafting file is created based upon the dimensional specifications of engine gasket 100. However, the dimensions are slightly modified to account for an "etch factor" utilized to produce desirable edge contours on the fabricated gasket. A red Mylar® lithograph or rubylith of each side of the finished engine gasket 100 is then prepared using the dimensional specifications of the CAD file. The rubyliths are generally larger in scale than the actual finished engine gasket and include the appropriate etch factors. Once created, each rubylith must be trimmed, either manually or by means of an automated process, to remove the excess material that extends beyond the dimensional boundaries of the gasket. A laser photo-plotter is then used to reduce the trimmed rubyliths to actual scale with great precision. The output of the photo-plotter or the "photo-tools" are actually the negative profiles of the top and bottom surfaces of the finished engine gasket 100. It should be recognized that the photo-plotter can be employed to produce multiple images so as to increase productivity.

Turning now to FIGS. 4a–11, there is illustrated in sequential order, the methodical steps employed in the fabrication of embossed engine gasket 100. Initially, as illustrated in FIGS. 4a and 4b, an uncontoured metallic blank or gasket preform 10 is provided which has opposed substantially planar top and bottom surfaces 10a and 10b and a dimensional thickness "t" of about between 0.10 mm and 0.60 mm. The overall dimensional profile of gasket preform 10, i.e., the length and width thereof, is substantially identical to that of the finished engine gasket 100, with the exception of the "etch factor" and it includes preformed apertures that correspond to the sealing ports of finished gasket 100. Those skilled in the art will readily appreciate that the metal blank or gasket preform illustrated in FIGS. 4a and 4b may initially provided without sealing ports, whereby the sealing ports would be chemically etched into the blank along with the other structural features of the gasket. This alternative is clearly envisioned and within the scope of the claimed invention.

The next methodical step in the gasket fabrication process of the subject invention involves preparing the metal surfaces of gasket preform 10 for chemical etching. This entails mechanically cleaning the metal surfaces of the gasket preform with an abrasive material, such as, for example, steel wool, and chemically cleaning the metal surfaces with a solvent to remove oil, scale, dirt and other debris that may be present. Thereafter, the top and bottom surfaces of gasket preform 10 are each coated with a thin layer of photochemical resist material 12 utilizing a dry film lamination process, as illustrated, for example, in FIG. 5. Once cured by ultraviolet radiation, the resist material will effectively protect certain surface areas of the gasket preform from the effects of the chemical etching agent utilized in a later step of the gasket fabrication process.

The next methodical step in the gasket fabrication process of the subject invention involves laminating the respective photo-tools onto the resist coated top and bottom surfaces 10a and 10b of gasket preform 10, as illustrated, for example, in FIGS. 6a and 6b. The photo-tools may be presented as sets of individual photo-tools or on a film or sheet. Referring to FIG. 6a, the upper photo-tool 14a, which is actually a set of photo-tools, is configured in such a manner so as to cover or mask substantially all of the coated top surface 10a of gasket preform 10, with the exception of an annular section extending about the periphery of each sealing port defined in the gasket preform. These uncovered coated regions correspond to the raised contact surfaces of each circumferential embossment defined on the fabricated engine gasket 100, namely, raised contact surfaces 201a–203a of the greater sealing port embossments 201–203, and the raised contact surfaces 211a–214a of the lesser sealing port embossments 211–214. Consequently, a majority of the surface area of the coated top surface 10a of gasket preform 10 will be masked or protected from exposure to ultraviolet radiation in a subsequent step in the fabrication process.

Referring to FIG. 6b, the lower photo-tool 14b, which is also actually a set of photo-tools, is configured in such a manner so as to only cover or mask the areas of the coated bottom surface 10b that correspond to the recessed surfaces of each circumferential embossment defined on the fabricated engine gasket 100, namely, the recessed surfaces 201b–203b of the greater sealing port embossments 201–203, and the recessed surfaces 211b–214b of the lesser sealing port embossments 211–214. Consequently, a majority of the surface area of the coated bottom surface 10b of gasket preform 10 will remain susceptible to ultraviolet radiation in a subsequent step in the fabrication process.

Figure 7B:
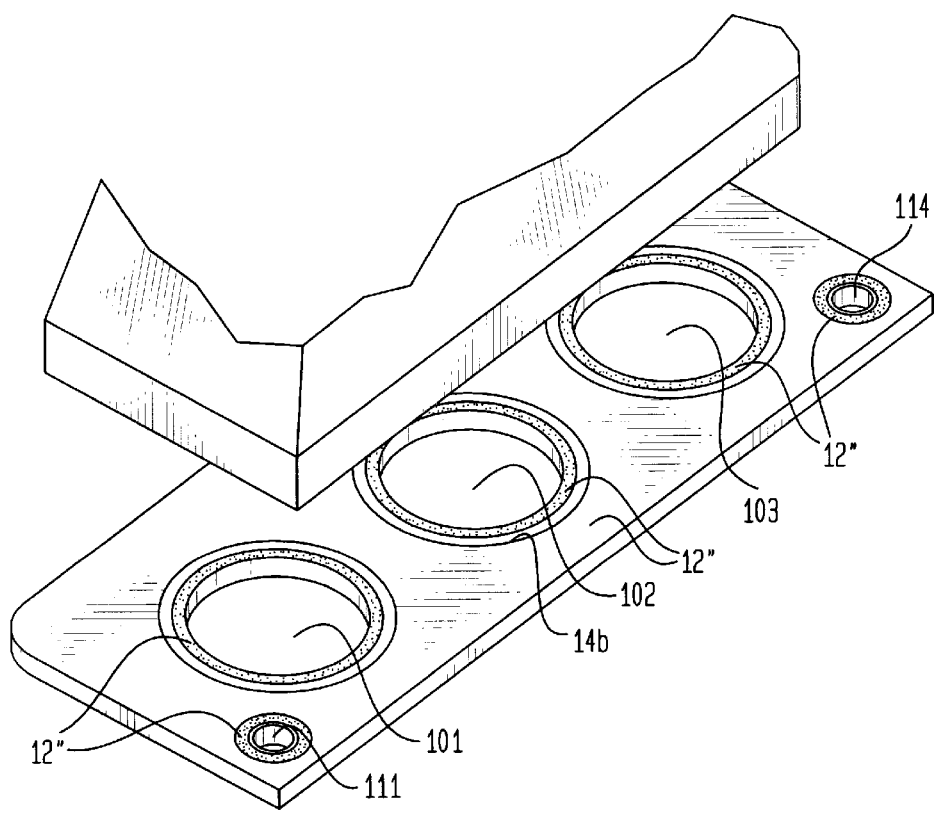
FIG. 7b is a perspective view from below illustrating the bottom surface of the laminated gasket preform with the template elements applied thereto and exposed to ultraviolet radiation to cure the photochemical resist material delimiting the peripheral area of each opening defined in the gasket preform.

Following the step of masking the coated top and bottom surfaces 10a and 10b of gasket preform 10, the gasket preform is exposed to ultraviolet radiation for a predetermined period of time to cure all of the unmasked photochemical resist material located on either side of the gasket preform, as illustrated in FIGS. 7a and 7b. The top and bottom surfaces of the gasket preform may be irradiated concomitantly or independently During the irradiation period, the top and. bottom photo-tools 14a and 14b prevent the masked photochemical resist material from being cured. Accordingly, the unmasked photochemically coated regions 12' which correspond to the raised contact surface of each circumferential embossment defined on the top surface of the fabricated engine gasket 100 become cured, as do the unmasked photochemically coated regions 12" that delineate the recessed surface of each circumferential embossment defined on the fabricated engine gasket 100.

Figure 8:
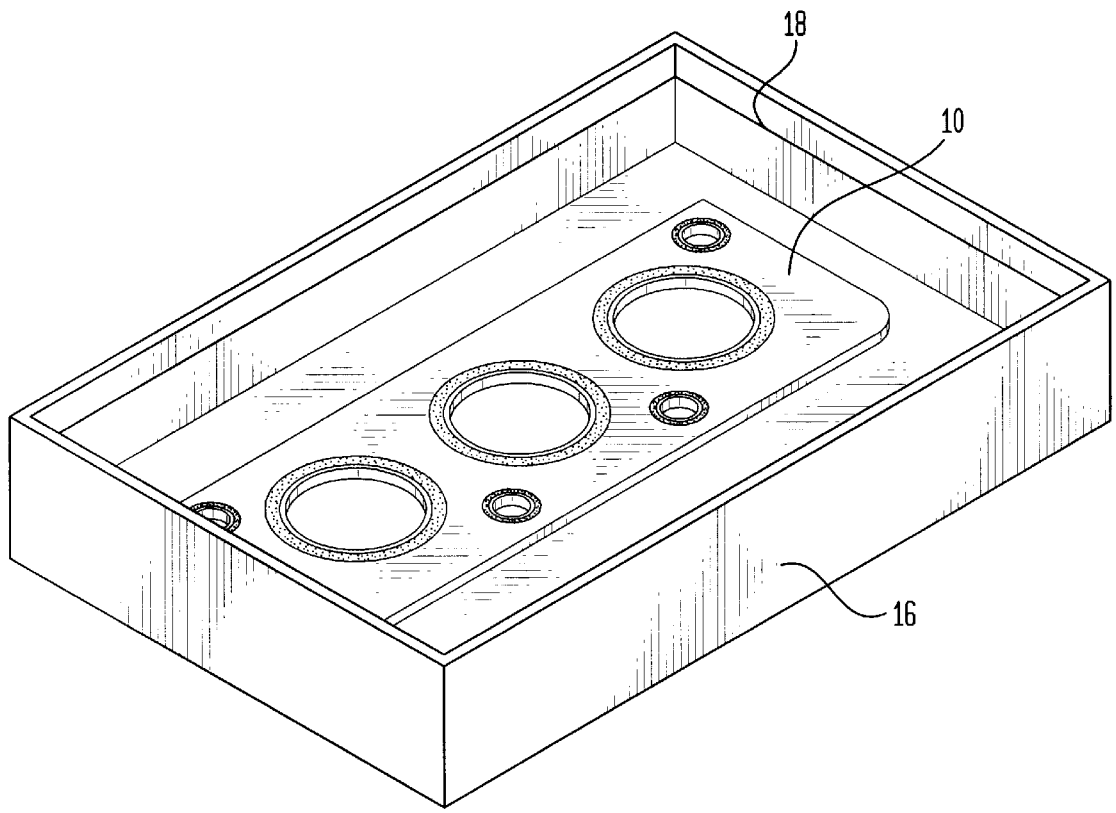
FIG. 8 illustrates the gasket preform within a developer bath that removes the uncured photochemical resist material therefrom.
Figure 9A:
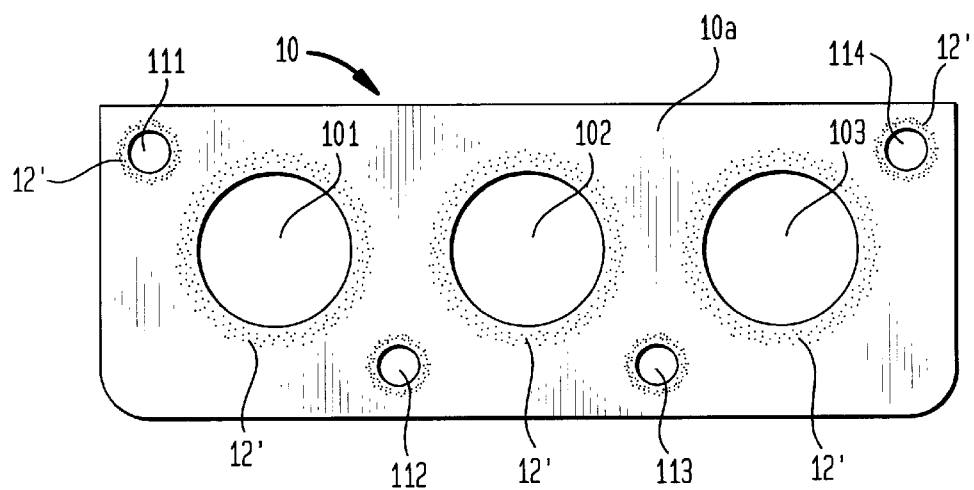
FIG. 9a is a top plan view of the gasket preform illustrating the contrast between the cured photochemical resist material and the exposed metal surfaces thereof.

At the conclusion of the ultraviolet irradiation period, gasket preform 10 is placed into a bath 16 containing a developer solution 18 which removes the photo-tools and the uncured photochemical resist material from the top and bottom surfaces of the gasket preform, as illustrated, for example, in FIG. 8. Thus, as shown in FIG. 9a, the only photochemical resist material remaining on the top surface 10a of gasket preform 10 is the cured resist material 12' which extends about the periphery of each sealing port to define the raised contact surface of each embossment. The remaining surface area of the top surface 10a is exposed metal.

Figure 9B:
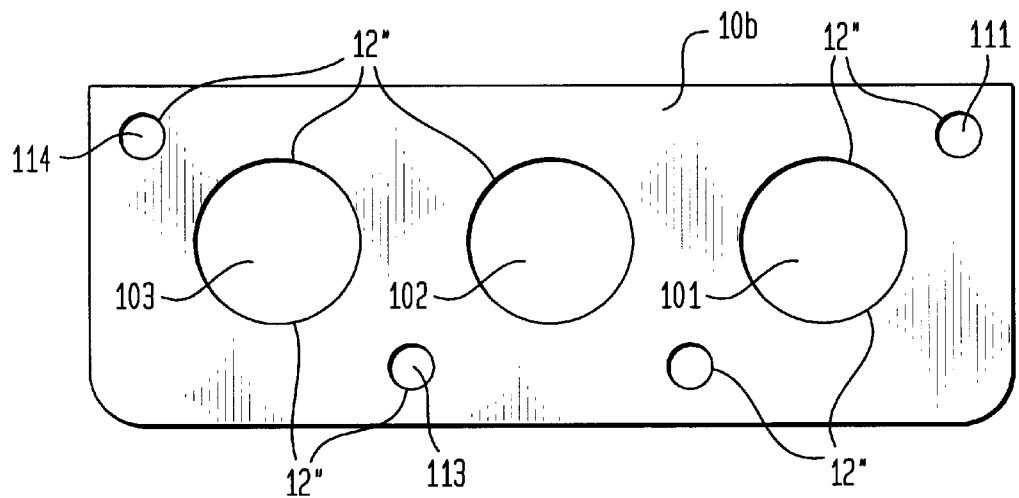
FIG. 9b is a bottom plan view of the gasket preform illustrating the contrast between the cured photochemical resist material and the exposed metal surfaces thereof.

In contrast, as illustrated in FIG. 9b, after the developer bath, substantially all of the surface area of the bottom surface 10b of gasket preform 10 is covered by cured photochemical resist material 12". Thus, the only exposed metal surfaces on the bottom surface 10b of gasket preform 10 are the annular (cross-hatched) regions extending about the periphery of each sealing port which delineate the recessed portion of each embossment.

Figure 10:
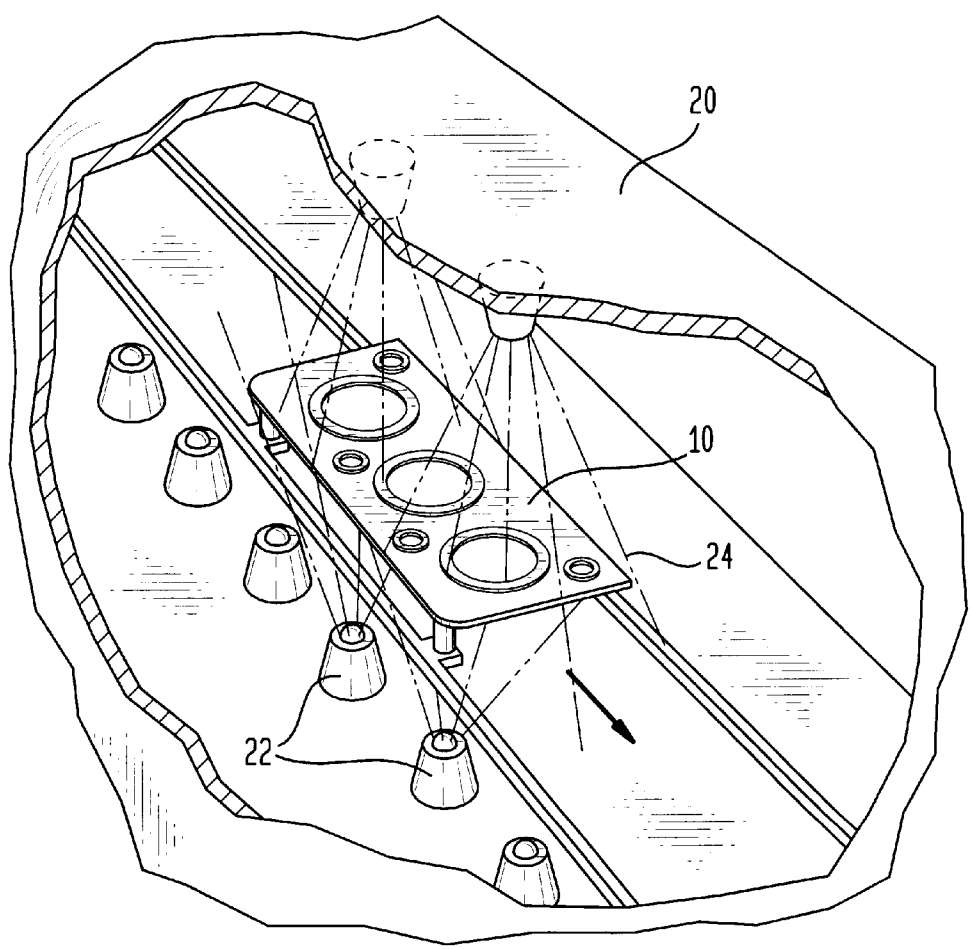
FIG. 10 illustrates the gasket preform as it is conveyed through a chemical bath in which the exposed metal surfaces of the gasket preform are sprayed with a chemical etching agent.

Referring now to FIG. 10, the next methodical step in the gasket fabrication process of the subject invention involves exposing gasket preform 10 to a chemical etching agent. Preferably, in this step of the process, gasket preform 10 is conveyed along a path extending through an enclosed chamber 20 in which a plurality of spray nozzles 22 direct a suitable chemical etching agent, preferably a ferric chloride solution 24, toward the top and bottom surfaces 10a and 10b of gasket preform 10 for a predetermined period of time. The chemical etching agent acts to reduce the thickness of the exposed metal surfaces of the gasket, i.e., areas that are absent the cured chemical resist material. Those skilled in the art will readily appreciate that the longer gasket preform 10 is exposed to the chemical etching agent within chamber 20, the greater will be the reduction in the thickness of the exposed metal surfaces thereof. Preferably, the time of exposure to the etching agent is sufficient to reduce the overall thickness of the exposed metal areas of the gasket preform from an initial thickness of about 0.40 mm to a final thickness of about 0.30 mm. Thus, the raised portion of each embossed bead preferably extends about 0.10 mm above the top surface of the fabricated gasket, and the recessed portion of each embossment is about 0.10 mm in depth. These dimensions are merely exemplary and should not be considered a limiting the method of the subject invention disclosed herein.

Figure 11:
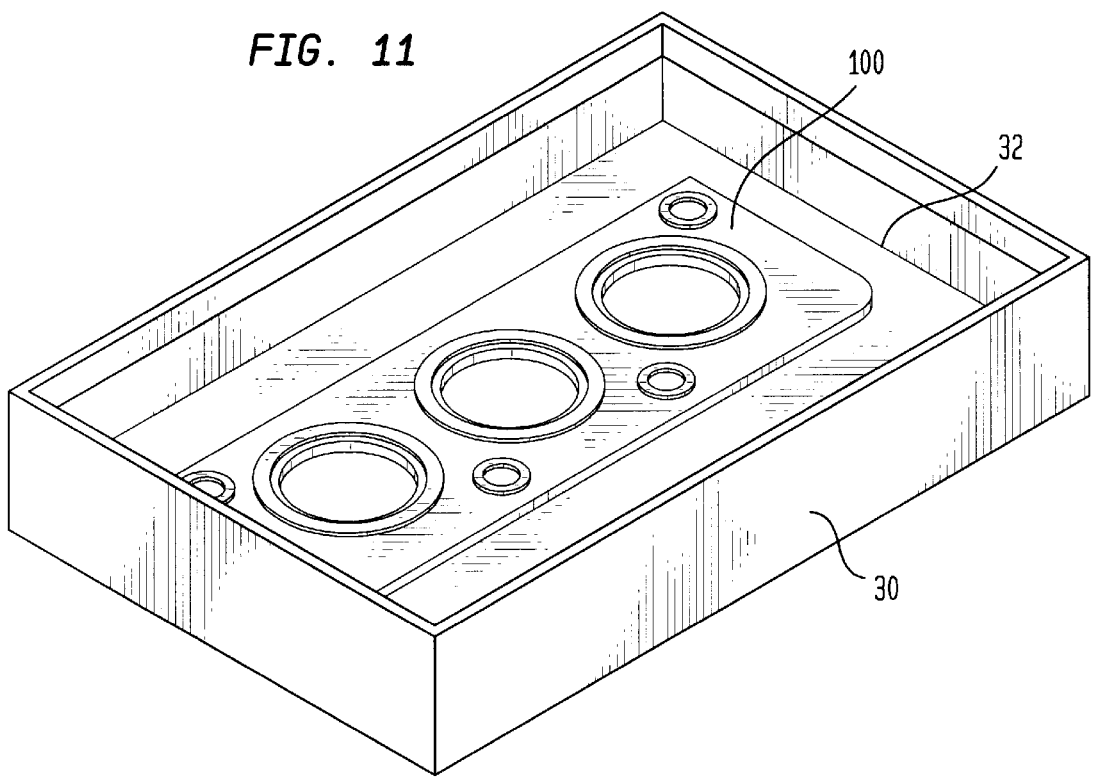
FIG. 11 illustrates the chemically etched gasket preform in a stripping bath that removes the cured chemical resist material from the top and bottom surfaces of the metallic gasket.

As illustrated in FIG. 11, after the chemical etching procedure, the embossed metal gasket 100 is transferred to a bath 30 containing a stripping solution 32 which removes all of the remaining cured chemical resist material from the top and bottom surfaces of thereof. Thereafter, the finished embossed engine gasket 100 is rinsed and dried in a conventional manner. Subsequently, a sealant layer or coating may be applied to the surfaces of engine gasket 100 to enhance the sealing characteristics thereof. The sealant layer may comprise an elastomeric material, PTFE or other materials common to the gasket manufacturing.

As discussed hereinabove, the embossed beads of an engine gasket are designed to elastically deform or compress when the gasket is installed on an engine to provide an enhanced static seal between two engine components. However, during installation, if the beads are overcompressed beyond the elastic limits of the gasket material, the gasket will cease to provide an effective seal between the two engine components. To overcome this problem, it is well known in the art to limit the compression of a raised bead by folding over a portion of the beaded gasket adjacent the bead to function as a shim.

Figure 12:
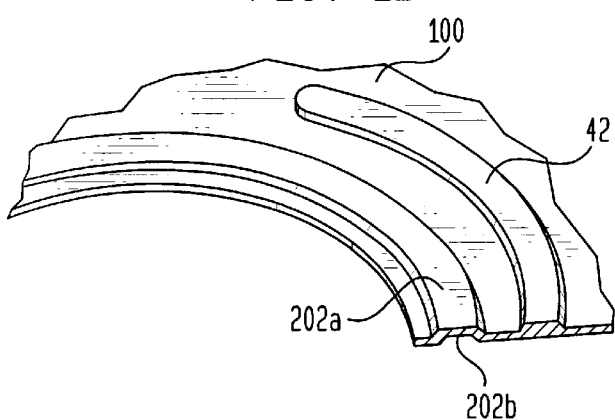
FIG. 12 is a perspective view of a portion of a chemically etched metallic gasket having an arcuate compression stopper etched in the, top surface thereof adjacent the outer periphery of the embossed bead extending about the periphery of the sealing bore.
Figure 13:
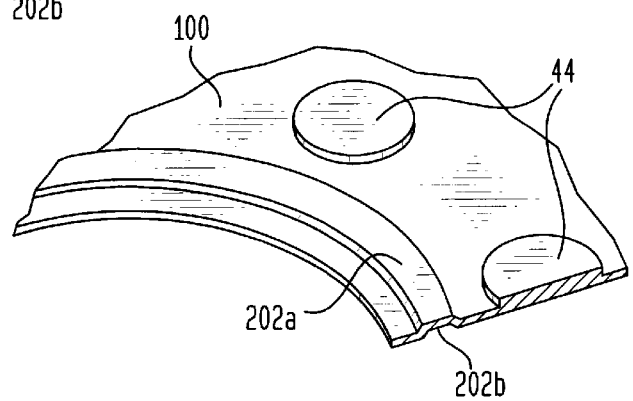
FIG. 13 is a perspective view of a portion of a chemically etched metallic gasket having a plurality of circumferentially spaced apart compression stoppers etched in the top surface thereof adjacent the outer periphery of the embossed bead extending about the periphery of the sealing bore.

In the present invention however, a compression stopper can be chemically etched into the top surface 10a of the engine gasket. For example, as shown in FIG. 12, an arcuate compression stopper 42 can be formed adjacent the radially outer periphery of an embossed bead. Alternatively, as shown in FIG. 13, a series of circular compression stoppers 44 can be disposed about the outer periphery of an embossed bead. Generally, the height of the chemically etched compression stopper will be slightly less than the height of the raised bead with which it is associated, and it will not include a recessed area. Accordingly, when fabricating an etched engine gasket with a compression stopper, only the upper photo-tool would include the dimensional and geometric details associated therewith. The actual height of the compression stopper can be varied by controlling the time of exposure of the gasket preform to the chemical etching agent.

Figure 14:
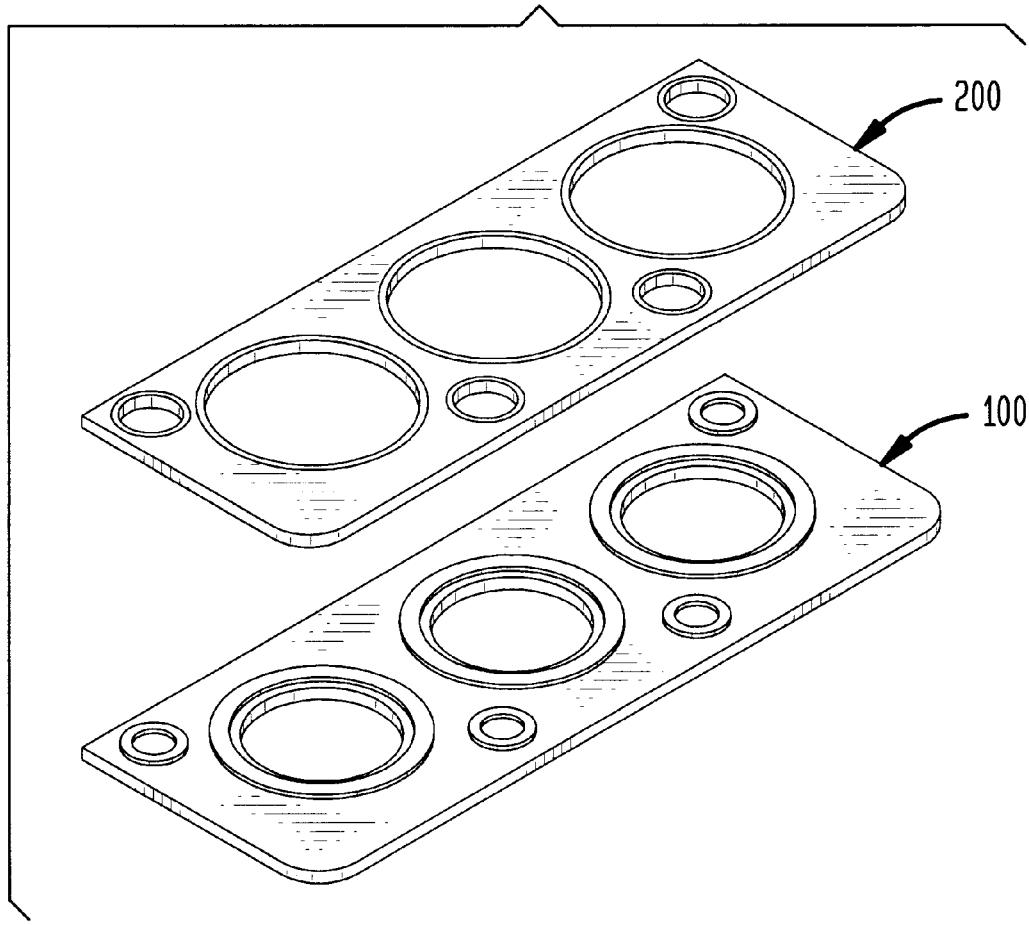
FIG. 14 is a perspective view of a separate compression stopper which manufactured in accordance with the chemical etching process disclosed herein and which is dimensioned and configured to be coextensive with the embossed gasket.

As illustrated in FIG. 14, the chemical etching process disclosed herein can be employed to fabricate an entire stopper layer 200 that is dimensioned and configured to be coextensive with the top surface of the finished metal gasket 100 to limit compression of each of the sealing embossments provided thereon, and provide an additional sealing layer between two engine components.

Although the embossed engine gasket and the novel fabrication method of the subject invention have been described with respect to a preferred embodiment, it is apparent that modifications and changes can be made thereto without departing from the spirit and scope of the invention as defined by the appended claims.

What is claimed is:

1. A method of manufacturing a metal gasket including at least one sealing port having a bead circumscribing the periphery thereof, the bead being defined on a first side of the metal gasket by a raised surface area and on a second side of the metal gasket by a recessed surface area, the method comprising the steps of:
   a) supplying a metal gasket preform having a predetermined thickness and opposed first and second planar surfaces;
   b) laminating the opposed first and second planar surfaces of the gasket preform with a chemically resistive material;
   c) applying a mask to the first planar surface of the gasket preform for masking the chemically resistive material thereon in such a manner so as to delineate at least a first portion of at least one sealing port and a raised surface area of a bead circumscribing the sealing port;
   d) applying a mask to the second planar surface of the gasket preform for masking the chemically resistive material thereon in such a manner so as to delineate at least a second portion of the at least one sealing port and a recessed surface area of the bead circumscribing the sealing port;
   e) curing the unmasked chemically resistive material on the opposed first and second planar surfaces of the gasket preform;
   f) removing at least the uncured chemically resistive material from the opposed first and second planar surfaces of the gasket preform; and
   g) exposing the gasket preform to a chemical etching agent for a predetermined period of time so as to reduce the thickness of the gasket preform in areas which are absent cured chemically resistive material, thereby forming opposed raised and recessed surfaces areas of a bead circumscribing the periphery of the at least one sealing port.

2. A method according to claim 1, further comprising the step of mechanically and chemically cleansing the gasket preform to remove imperfections and debris therefrom prior to the step of laminating the opposed first and second planar surfaces with a chemically resistive material.

3. A method according to claim 2, wherein said step of laminating the opposed first and second planar surfaces of the gasket perform comprises laminating the opposed surfaces of the gasket preform with a photochemical resist material.

4. A method according to claim 3, further comprising the step of fabricating the mask for masking the opposed first and second surfaces of the gasket preform, which includes the additional steps of:
   a) generating graphic representations of opposed first and second sides of the metal gasket,
   b) generating a respective lithograph of each graphic representation, and
   c) photographically reproducing a respective negative image of each lithograph.

5. A method according to claim 4, wherein said step of generating a respective lithograph of each graphic representation comprises generating a respective rubylith of each graphic representation, each rubylith having dimensions which are greater than the respective dimensions of each graphic representation.

6. A method according to claim 5, wherein said step of curing the unmasked chemically resistive material includes the step of exposing the unmasked photochemical resist material to ultraviolet radiation.

7. A method according to claim 6, wherein said step of removing at least the uncured chemically resistive material includes the step of bathing the gasket preform in a developer chemical.

8. A method according to claim 3, wherein said step of exposing the gasket preform to a chemical etching agent includes the step of spraying the opposed first and second planar surfaces of the gasket preform with a ferric chloride solution.

9. A method according to claim 8, further comprising the step of removing the cured chemically resistive material from the metal gasket by placing the metal gasket in a stripping solution.

10. A method according to claim 9, further comprising the sequential steps of rinsing and drying the metal gasket.

11. A method according to claim 10, further comprising the step of applying a sealant material to at least one of the opposed first and second surfaces of the metal gasket.

12. A method of manufacturing a metal gasket including at least one sealing port having a bead circumscribing the periphery thereof, the bead being defined on a first side of the metal gasket by a raised surface area and on a second side of the metal gasket by a recessed surface area, the method comprising the steps of:

a) supplying a metal gasket preform having a predetermined thickness, opposed first and second planar surfaces, and at least one sealing port defined therein;

b) laminating the opposed first and second planar surfaces of the gasket preform with a photochemical resist material;

c) applying a first template to the first planar surface of the gasket preform to mask the photochemical resist material thereon in such a manner so as to delineate at least a raised surface area of a bead circumscribing the at least one sealing port and a raised compression stopper adjacent an outer periphery of the raised surface area of the bead;

d) applying a second template to the second planar surface of the gasket preform to mask the photochemical resist material thereon in such a manner so as to delineate at least a recessed surface area of the bead circumscribing the at least one sealing port;

e) curing the unmasked photochemical resist material on the opposed first and second planar surfaces of the gasket preform;

f) removing the uncured photochemical resist material and the templates from the opposed first and second planar surfaces of the gasket preform; and g) exposing the gasket preform to a chemical etching agent for a predetermined period of time so as to reduce the thickness of the gasket preform in areas which are absent cured photochemical resist material, thereby forming opposed raised and recessed surface areas of a bead circumscribing the periphery of the at least one sealing port and a raised compression stopper adjacent an outer periphery of the raised surfaces area of the bead.

13. A method according to claim 12, further comprising the step of mechanically and chemically cleansing the gasket preform to remove imperfections and debris therefrom prior to said step of laminating the opposed first and second planar surfaces with a photochemical resist material.

14. A method according to claim 13, further comprising the step of fabricating the first and second templates, which includes the additional steps of:

a) generating graphic representations of opposed first and second sides of the metal gasket;

b) generating a respective rubylith of each graphic representation having dimensions which are greater than the respective dimensions of each graphic representations; and c) photographically reproducing a respective negative image of each rubylith.

15. A method according to claim 14, wherein said step of curing the unmasked photochemical resist material includes the step of exposing the unmasked photochemical resist material to ultraviolet radiation.

16. A method according to claim 15, wherein said step of removing the uncured chemically resistive material and both of the templates includes the step of bathing the gasket preform in a developer chemical.

17. A method according to claim 16, wherein said step of exposing the gasket preform to a chemical etching agent includes the step of spraying the opposed first and second planar surfaces of the gasket preform with a ferric chloride solution.

18. A method according to claim 17, further comprising the step of removing the cured chemical resist material from the metal gasket by placing the metal gasket in a stripping solution.

19. A method according to claim 18, further comprising the sequential steps of rinsing and drying the metal gasket.

20. A method according to claim 19, further comprising the step of applying a sealant material to at least one of the opposed first and second surfaces of the metal gasket.

21. A method of manufacturing a metal gasket including at least one sealing port having an embossment circumscribing the periphery thereof, the method comprising the steps of:

a) supplying a metal gasket preform having a predetermined thickness, opposed first and second planar surfaces, and at least one sealing port defined therein;

b) laminating at least the first planar surface of the gasket preform with a layer of chemically resistive material;

c) masking the chemically resistive material on the first planar surface of the gasket preform in such a manner so as to delineate at least a raised surface area of an embossment circumscribing the sealing port;

d) curing the masked chemically resistive material on the first planar surface of the gasket preform;

e) removing at least the uncured chemically resistive material from the first planar surface of the gasket preform to expose surface areas thereof; and f) exposing the first planar surface of the gasket preform to a chemical etching agent for a predetermined period of time so as to reduce the thickness of the exposed surface areas of the first planar surface, thereby forming the raised surface area of an embossment circumscribing the periphery of the at least one sealing port.

22. A method according to claim 21, further comprising the step of laminating the second planar surface of the gasket preform with a layer of chemically resistive material.

23. A method according to claim 22, further comprising the step of masking the chemically resistive material on the second planar surface in such a manner so as to delineate at least a recessed surface area of the embossment.

24. A method according to claim 23, further comprising the step of curing the unmasked chemically resistive material on the second planar surface of the gasket preform.

25. A method according to claim 24, further comprising the step of removing the uncured chemically resistive material from the second planar surface of the gasket preform to expose surface areas thereof.

26. A method according to claim 25, further comprising the step of exposing the second planar surface of the gasket preform to a chemical etching agent for a predetermined period of time so as to reduce the thickness of the exposed surface area of the second planar surface, thereby forming the recessed surface area of the embossment.

* * * * *